(12) United States Patent
Jawarani et al.

(10) Patent No.: US 7,544,576 B2
(45) Date of Patent: Jun. 9, 2009

(54) DIFFUSION BARRIER FOR NICKEL SILICIDES IN A SEMICONDUCTOR FABRICATION PROCESS

(75) Inventors: Dharmesh Jawarani, Round Rock, TX (US); Chun-Li Liu, Mesa, AZ (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 341 days.

(21) Appl. No.: 11/192,968

(22) Filed: Jul. 29, 2005

(65) Prior Publication Data

US 2007/0026593 A1 Feb. 1, 2007

(51) Int. Cl.
*H01L 21/40* (2006.01)

(52) U.S. Cl. ............... 438/300; 438/582; 438/682; 257/E21.211; 257/E21.37

(58) Field of Classification Search ........... 438/222, 438/229, 280, 299–300; 257/344, 408, 513–514, 257/E21.211, E21.37, E21.373
See application file for complete search history.

(56) References Cited

U.S. PATENT DOCUMENTS

| | | | |
|---|---|---|---|
| 6,037,605 A * | 3/2000 | Yoshimura | 257/25 |
| 6,483,158 B1 * | 11/2002 | Lee | 257/408 |
| 6,541,343 B1 * | 4/2003 | Murthy et al. | 438/299 |
| 6,566,680 B1 * | 5/2003 | Krivokapic | 257/30 |
| 6,812,103 B2 * | 11/2004 | Wang et al. | 438/300 |
| 6,887,762 B1 * | 5/2005 | Murthy et al. | 438/300 |
| 7,078,205 B2 * | 7/2006 | Bandaru et al. | 435/193 |
| 7,078,285 B1 * | 7/2006 | Suenaga | 438/199 |
| 7,195,985 B2 * | 3/2007 | Murthy et al. | 438/341 |
| 2004/0072446 A1 * | 4/2004 | Liu et al. | 438/719 |
| 2006/0115949 A1 * | 6/2006 | Zhang et al. | 438/300 |

OTHER PUBLICATIONS

Gambino et al., "Silicides and ohmic contacts", Materials Chemistry and Physics, 52 (1998) 99-146.*
Kuztenov et al., "Nickel atomic diffusion in amorphous silicon", App. Physi. Lett.; 66 (17), Apr. 24, 1995.*
Qu et al., "Investigation on Ni reaction with sputtered amorphous SiGe thin film on SiO2 substrate", J. Vac. Sci. Technol. A, 24(1), Jan./Feb. 2006.*
Spit et al., Diffusivity and Solubility of Ni (63Ni) in Monocrystalline Si, PRB, 1988, pp. 1255-1260, vol. 39, No. 3.
Nowak et al., Diffusion of Nickel Through Titanium Nitride Films, JVSTA, Nov./Dec. 1985, p. 2242-2245,vol. 3, No. 6.

* cited by examiner

*Primary Examiner*—Douglas M Menz
*Assistant Examiner*—Matthew W Such

(57) ABSTRACT

A semiconductor fabrication method includes forming a gate module overlying a substrate. Recesses are etched in the substrate using the gate module as a mask. A barrier layer is deposited over the wafer and anisotropically etched to form barrier "curtains" on sidewalls of the source/drain recesses. A metal layer is deposited wherein the metal layer contacts a semiconductor within the recess. The wafer is annealed to form a silicide selectively. The diffusivity of the metal with respect to the barrier structure material is an order of magnitude less than the diffusivity of the metal with respect to the semiconductor material. The etched recesses may include re-entrant sidewalls. The metal layer may be a nickel layer and the barrier layer may be a titanium nitride layer. Silicon or silicon germanium epitaxial structures may be formed in the recesses overlying the semiconductor substrate.

8 Claims, 3 Drawing Sheets

DIFFUSION BARRIER FOR NICKEL SILICIDES IN A SEMICONDUCTOR FABRICATION PROCESS

FIELD OF THE INVENTION

The invention is in the field of semiconductor fabrication and, more particularly, fabrication processes that include use of silicides.

RELATED ART

Silicides are silicon-metal compounds used extensively in semiconductor fabrication processes to form low resistance contacts between metal interconnects and silicon structures including source/drain areas and polysilicon gate areas. Nickel is a promising candidate for silicide formation because nickel silicon (NiSi) exhibits a very low sheet resistance. Unfortunately, conventional nickel silicide processes have significant problems.

Nickel is a very fast diffuser in silicon. Nickel can diffuse through silicon several hundred nanometers at temperatures that are typical of conventional silicidation thermal treatments. Furthermore, this diffusion is enhanced by the presence of localized stresses in silicon. The diffusion rate of nickel in silicon has consequences for nickel silicide processes. In a typical nickel silicide process, nickel is deposited over silicon and heated to an annealing temperature. Ideally, the resulting alloy is NiSi, which has a desirably low sheet resistance and is not susceptible to oxidation. Unfortunately, the high rate of nickel diffusion causes lateral encroachment of NiSi in the surrounding silicon. Moreover, nickel depletion can occur as nickel in the NiSi diffuses through the silicon, resulting in the formation of $NiSi_2$, which has higher sheet resistivity and is prone to oxidation.

Referring to FIG. 9, a partial cross section view of a transistor 10 fabricated using convention nickel silicide processing is depicted. In the depicted embodiment, transistor 10 includes a buried oxide (BOX) layer 2 underlying a semiconductor layer 4. Isolation structures 6 are disposed on either side of semiconductor layer 4. A gate module 11 includes a gate dielectric 8 and an overlying polysilicon gate electrode 12. Dielectric spacers 14 are located on the sidewalls of gate electrode 12. Gate module 11 defines boundaries for source/drain regions 23 and a channel region 7 in semiconductor layer 4. Transistor 10 includes nickel silicide structures 31 in an upper portion of gate electrode 12 and 32 in an upper portion of source/drain regions 23. Ideally, nickel silicide structures 32 are confined to the upper portions of source/drain regions 23 and do not encroach significantly into channel region 7. In reality however, nickel silicide structures 32 frequently diffuse laterally to create unwanted encroachment regions 33 of nickel silicide within channel region 7. In FIG. 9, encroachment region 33 is shown as originating from only one of the nickel silicide structures 32, but encroachment may occur from either or both of the silicide structures 32.

It would be desirable to implement a nickel silicide fabrication process that addresses the problems associated with the high diffusivity of nickel in silicon.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, this disclosure describes a process for fabricating semiconductor devices with nickel silicides. The process includes the formation of nickel barrier structures or "curtains" at the periphery of the source/drain regions. The nickel barrier structures reduce or prevent the lateral nickel encroachment typical of conventional nickel silicide processing. In one embodiment, recesses are formed in the source/drain regions of a semiconductor transistor and, more particularly, a metal oxide semiconductor (MOS) transistor. A nickel barrier layer is deposited and etched anisotropically to leave behind the nickel barrier structures on sidewalls of the recesses. Barriers may also form on the inner sidewalls of a gate spacer material if conventional polysilicon material is used to form the gate. The recesses may then be refilled with a semiconductor such as silicon or silicon germanium. A metal layer including nickel is then deposited and the wafer is annealed. The metal layer reacts with the underlying silicon to form a nickel silicide. The unreacted portions of the metal layer are then removed to form a transistor with nickel silicide contact areas and nickel diffusion barrier structures in the substrate that prevent or restrict lateral migration of the nickel.

Figure 1:
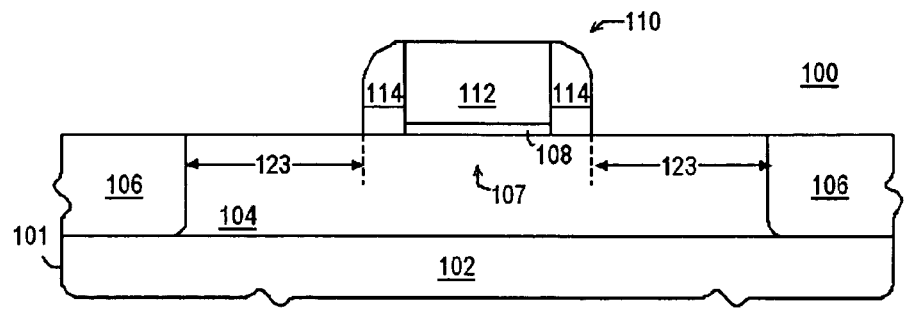
FIG. 1 is a partial cross sectional view of a wafer at an intermediate stage in a semiconductor fabrication process according to one embodiment of the present invention in which a transistor gate module is formed overlying a semiconductor on insulator (SOI) substrate.

Turning now to FIG. 1, a partial cross section view of a wafer 101 at an intermediate stage in the fabrication of an integrated circuit 100. In the depicted embodiment, wafer 101 is a semiconductor on insulator (SOI) wafer that includes a buried oxide (BOX) layer 102 underlying a semiconductor layer 104. Wafer 101 likely includes an additional layer, sometimes referred to as the bulk layer or simply the bulk (not depicted), underlying BOX layer 102. Other embodiments use conventional, bulk wafers (i.e., wafers that do not include a buried oxide layer).

As depicted in FIG. 1, the semiconductor layer 104 is electrically and physically isolated from adjacent semiconductor areas by shallow trench isolation (STI) structures 106 and the buried oxide layer 102, which will be familiar to those in the field of MOS fabrication processing. A gate module 110 has been formed overlying semiconductor layer 104. Gate module 110 includes a gate dielectric 108 and an overlying gate electrode 112. Gate dielectric 108 is preferably a thermally formed silicon dioxide, a silicon oxynitride, or a high dielectric constant (high k) material such as HfO2 and other metal oxides, metal silicates, and metal nitride films. Gate electrode is preferably comprised of polysilicon, but a metallic, an intermetallic compound, or a combination of these materials can also be used. Gate sidewall spacers 114 have been formed on the sidewalls of gate electrode 112 according to familiar processing. Spacers 114 are typically silicon nitride or silicon oxide or a combination of these. Gate module 112 defines boundaries for source/drain regions 123 and a channel region 107 in semiconductor layer 104.

Figure 2:
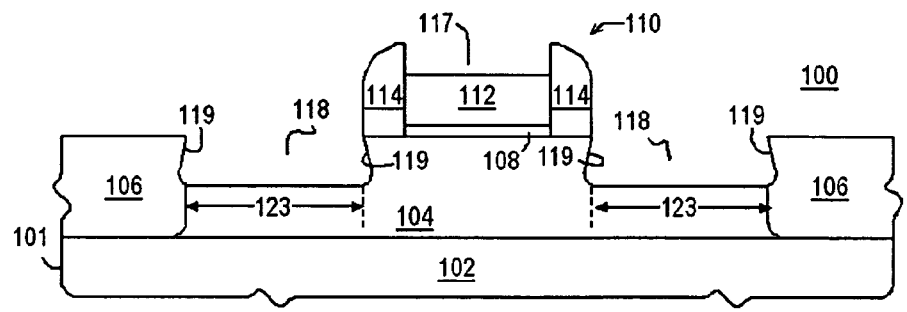
FIG. 2 depicts processing subsequent to FIG. 1 in which recesses or voids are formed in source/drain areas of the substrate self aligned to the transistor gate module.

Turning now to FIG. 2, recesses 118 are formed in source/drain regions 123 of semiconductor layer 104 of wafer 101. In the depicted embodiment, gate module 110 is used as a mask for a recess etch that produces recesses 118. In this implementation, recesses 118 are self aligned to gate module 110. In the depicted embodiment, the etch used to form recesses 118 is controlled to produce recesses 118 having re-entrant sidewalls 119 that facilitate the subsequent formation of nickel barrier structures. In one embodiment, a KOH solution may be used to form re-entrant sidewalls 119. In the depicted embodiment, the formation of recesses 118 also creates a void 117 where upper portions of gate electrode 112 have been removed. The depth of the recess is calculated to be approximately slightly higher than the expected thickness of the silicon that is consumed in the process of silicidation later in the fabrication process. For example, 10 nm of Ni is expected to consume about 18.4 nm of Si and form about 22 nm of NiSi. Therefore, a preferred recess depth for such a process will be about 25 nm such that the barrier liner can provide an overlap margin for the silicide layer to be formed subsequently.

Figure 3:
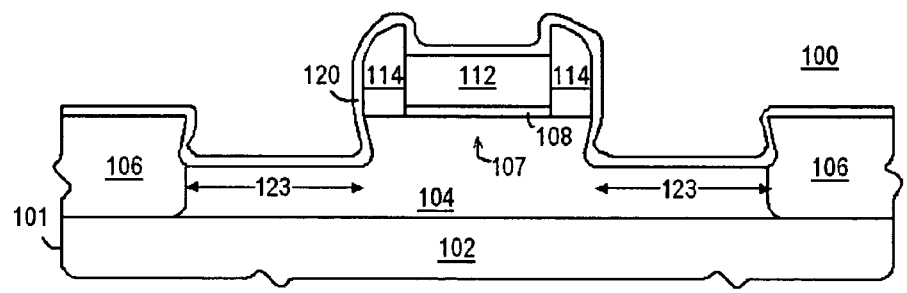
FIG. 3 depicts processing subsequent to FIG. 2 in which a barrier metal layer is deposited over the wafer.

In FIG. 3, a conformal barrier layer 120 is blanket deposited over wafer 101. In one embodiment, barrier layer 120 includes a layer of titanium nitride (TiN). TiN is preferred as a barrier to nickel migration because it is known that nickel cannot migrate effectively through TiN. Nickel can migrate several hundred nanometers in silicon during a 30 second 340 C anneal, but only migrates approximately 0.1 nm in TiN under the same conditions. Although TiN is preferred as the nickel barrier, other materials having properties similar to TiN may also be used. These similar materials would include, but are not limited to, TaN, ZrN, MoN, WN, TaSiN, TiSiN, and TiAlN. A thickness of barrier layer 120 is preferably in the range of approximately 1 to 20 nm. Important for purposes of containing nickel diffusion, the diffusivity of nickel in barrier layer 120 is at least an order of magnitude less than the diffusivity of nickel in semiconductor layer 104.

Figure 4:
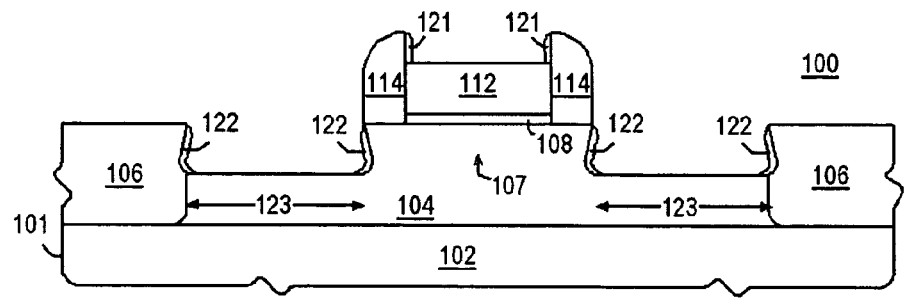
FIG. 4 depicts processing subsequent to FIG. 3 in which the barrier layer is etched anisotropically to remove portions of the barrier metal layer overlying horizontal portions of the gate and the substrate while leaving in place portions of the barrier metal layer on sidewall or reentrant portions of the wafer.

Turning now to FIG. 4, barrier layer 120 is etched anisotropically to remove horizontally oriented portions of barrier layer 120 (i.e., those portions of barrier layer 120 overlying horizontal or flat portions of wafer 101) while leaving behind barrier curtains 122 adjacent to sidewalls 119 of recesses 118. In the depicted embodiment, the anisotropic etch that forms barrier curtains 122 also leaves behind barrier curtains 121 adjacent to the inner sidewalls of spacers 114, which are exposed by recesses 117. The orientation and composition of barrier curtains 122 will greatly restrict the lateral migration or encroachment of nickel silicide. As depicted in FIG. 4, barrier curtains 122 are elongated "curtains" extending downward from an upper surface of wafer 101 at the edges of source/drain regions 123 (i.e., the regions of semiconductor layer 104 aligned to and disposed on either side of gate module 110).

The reduced lateral migration due to the presence of barrier structures or barrier curtains 122 is achieved without substantially affecting the source/drain sheet resistance. It is estimated that the presence of barrier curtains 122 increases the source/drain sheet resistance by approximately 1% or less.

Figure 5:
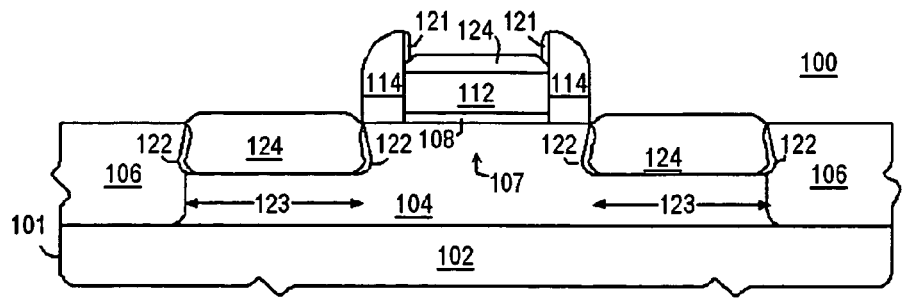
FIG. 5 depicts processing subsequent to FIG. 4 in which a semiconductor is selectively formed overlying silicon portions of the wafer.

Turning to FIG. 5, an optional processing step is shown in which a semiconductor is selectively grown on portions of wafer 101 where silicon or another semiconductor is exposed. In one embodiment, semiconductor structures 124 are formed using selective epitaxy to fill, at least partially, the source/drain recesses 118 (of FIG. 4). In the embodiment depicted in FIG. 5, selective epitaxy forms semiconductor structures 124 over gate electrode 112 and, within the source/drain recesses 118, over semiconductor layer 104. Epitaxial structures 124 may be doped n-type or p-type during epitaxial formation. Semiconductor structures 124 may be silicon, silicon germanium, or another semiconductor material.

Figure 6:
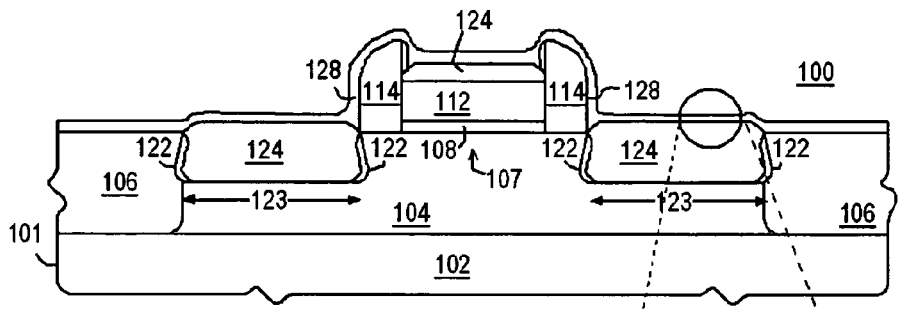
FIG. 6 depicts processing subsequent to FIG. 5 in which a metal stack is deposited over the wafer.
Figure 7:
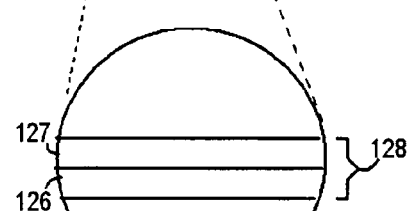
FIG. 7 is a detail view of a portion of FIG. 6 emphasizing an embodiment of the metal stack.

Referring to FIG. 6, a metal stack 128 is blanket deposited over wafer 101. Metal stack 128 includes a metal to be used in a subsequently formed silicide. In an embodiment emphasized in the detail view of FIG. 7, metal stack 128 includes multiple layers. In one embodiment, metal stack 128 includes a metal layer 126 containing the silicide metal (e.g., nickel) underlying a sacrificial capping layer 127, which is preferably TiN. Capping layer 127 prevents oxidation of the underlying metal during silicide formation. In the preferred embodiment, the thickness of metal layer 126 is in the range of approximately 5 to 20 nm and the thickness of capping layer 127 is in the range of approximately 0 to 15 nm.

Figure 8:
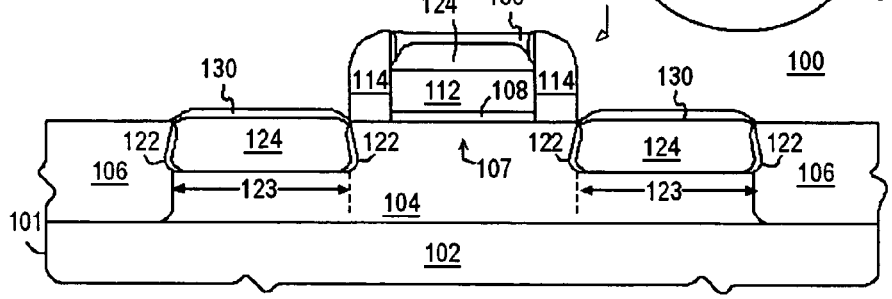
FIG. 8 depicts processing subsequent to FIG. 6 in which the metal stack is reacted with the underlying silicon to form a silicide and unreacted portions of the metal stack are removed.
Figure 9:
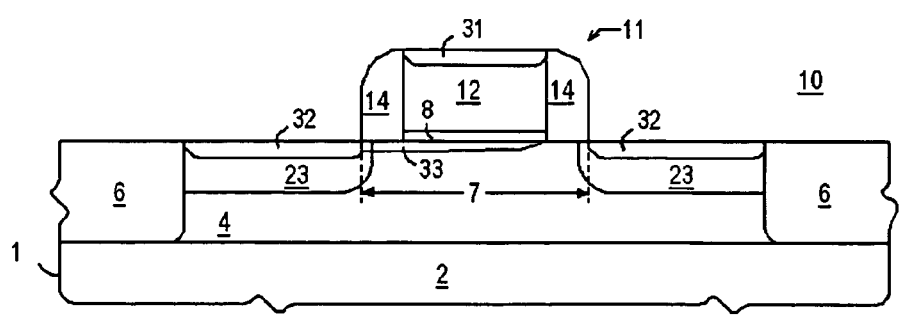
FIG. 9 is a cross sectional view of a transistor including a nickel silicide structure fabricated according to prior art processing techniques illustrating silicide encroachment.

In FIG. 8, an anneal is performed to react the metal stack 128 with the silicon or other semiconductor on which stack 128 is deposited. According to well known silicide formation techniques, the anneal step results in selective formation of silicide structures 130 where metal stack 128 and, more specifically, metal layer 126 contacts exposed semiconductor material such as the semiconductor structures 124. Portions of the metal layer 128 not in contact with a semiconductor material are not reacted during the anneal step and are subsequently removed with a suitable wet etch. The wet etch also removes the capping layer 127. In a preferred embodiment, the recess depth 118, the thickness of the selective epitaxial layer 124, and the nickel metal thickness are carefully chosen such that the resulting top surface of silicide structure 130 after the thermal treatment is above the initial top surface of the semiconductor layer 104 before the recess etch. This is to ensure that the selective etch used to remove unreacted nickel and capping layer 127 does not attack barrier curtains 122 at the edges of the gate spacer and source/drain regions.

As depicted in FIG. 8, a silicide structure 130 has been formed on semiconductor structures 124. The presence of barrier curtains 122 during the anneal processing beneficially contains the nickel diffusion such that nickel depletion of NiSi layer 129 is reduced or eliminated. Thus, FIG. 8 depicts a transistor 140 that includes nickel silicide structures 129 overlying a semiconductor source/drain structure 124. Barrier curtains 122 are located at the edges of source/drain regions 123 to prevent the nickel silicide from migrating into a channel region 107 underlying gate electrode 112.

In the foregoing specification, the invention has been described with reference to specific embodiments. However, one of ordinary skill in the art appreciates that various modifications and changes can be made without departing from the scope of the present invention as set forth in the claims below. For example, although the wafer is depicted as an SOI wafer, conventional bulk-substrate wafers may be used. As another example, multiple gate devices such as FINFETs may be used. As yet another example, although the description omits details regarding various extension implants, halo implants, and the like, a variety of implementations for these implants are possible. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication method, comprising:
   forming a gate module, including a gate electrode overlying a gate dielectric, overlying a substrate of a semiconductor wafer;
   etching recesses in the semiconductor substrate using the gate module as an etch mask wherein the recesses are self aligned to the gate module;
   non-selectively depositing a barrier layer over the wafer, wherein the barrier layer is selected from the group consisting of TiN, TaN, ZrN, MoN, WN, TaSiN, TiSiN, and TiAlN;
   etching the barrier layer selectively to form barrier structures adjacent to sidewalls of the recesses by removing horizontally oriented portions of the barrier layer; and
   depositing a metal layer, wherein the metal layer contacts an underlying semiconductor within the recesses and the metal layer comprises a nickel layer;
   annealing the wafer to react portions of the metal layer with the underlying semiconductor to form a silicide selectively and, after said annealing, removing unreacted portions of the metal layer.

2. The method of claim 1, wherein a diffusivity of the metal with respect to the barrier structure material is an order of magnitude less than the diffusivity of the metal with respect to the semiconductor material.

3. The method of claim 1, wherein said etching recesses includes forming re-entrant sidewalls of the recesses.

4. The method of claim 1, wherein the barrier layer is titanium nitride.

5. The method of claim 1, further comprising forming a capping layer overlying the barrier layer, wherein the capping layer comprises titanium nitride.

6. The method of claim 1, further comprising, prior to said depositing of the metal layer, forming the underlying semiconductor in the recesses overlying the semiconductor substrate.

7. The method of claim 6, wherein the semiconductor structures comprise silicon or silicon germanium.

8. The method of claim 7, wherein forming the underlying semiconductor includes growing the semiconductor structures epitaxially.

* * * * *